United States Patent [19]
Ohata et al.

[11] Patent Number: 5,963,471
[45] Date of Patent: Oct. 5, 1999

[54] SEMICONDUCTOR DEVICE

[75] Inventors: Akiko Ohata, Tokyo; Akira Toriumi, Yokohama, both of Japan

[73] Assignee: Kabushiki Kaisha Toshiba, Kawasaki, Japan

[21] Appl. No.: 09/074,651

[22] Filed: May 8, 1998

[30] Foreign Application Priority Data

Mar. 16, 1995 [JP] Japan ................................ 7-056907
Jul. 21, 1995 [JP] Japan ................................ 7-185871

[51] Int. Cl.$^6$ ................................................ G11C 7/00
[52] U.S. Cl. .................... 365/174; 365/149; 257/25; 257/27
[58] Field of Search .................... 365/174, 149, 365/187; 257/105, 27, 24, 25

[56] References Cited

U.S. PATENT DOCUMENTS

| | | | |
|---|---|---|---|
| 4,985,621 | 1/1991 | Aull et al. | 250/213 A |
| 5,422,496 | 6/1995 | Komahara et al. | 257/24 |
| 5,534,714 | 7/1996 | Beam, III et al. | 257/25 |
| 5,604,154 | 2/1997 | Takahashi et al. | 437/186 |
| 5,661,681 | 8/1997 | Mori | 365/179 |
| 5,677,637 | 10/1997 | Nakazato et al. | 365/35 |

OTHER PUBLICATIONS

Likharev, Single–Electron Transistors: Electrostatic Analogs of the DC Squids, IEEE Transactions on Magnetics, vol. MAG–23, No. 2, Mar. 1987.

FED Journal, vol. 3, Suppl. 1, pp. 44–49, 1993, T. Van Duzer, et al., "Prospects for Superconductor–Semiconductor Electronic Hybrid Circuits and Systems".

*Primary Examiner*—Vu A. Le
*Attorney, Agent, or Firm*—Oblon, Spivak McClelland, Maier & Neustadt, P.C.

[57] ABSTRACT

A semiconductor integrated circuit comprising a first functional block consisting essentially of a first circuit which includes a small junction device, and a second functional block consisting essentially of a second circuit which includes a field effect transistor, the second functional block being mutually connected to the first functional block.

3 Claims, 12 Drawing Sheets

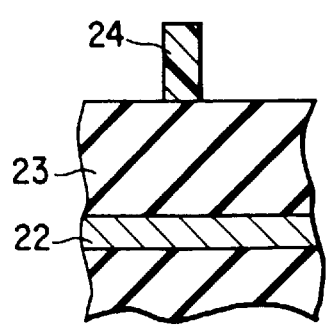 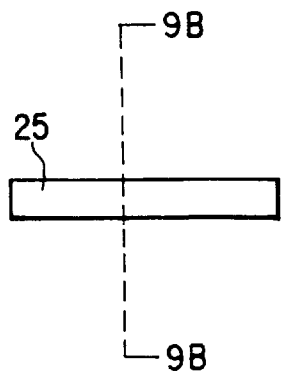
FIG. 9A    FIG. 9B
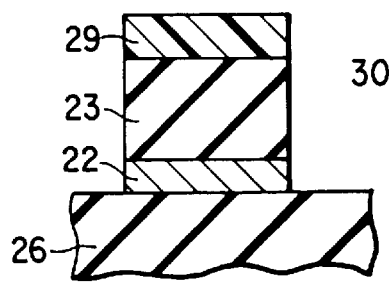 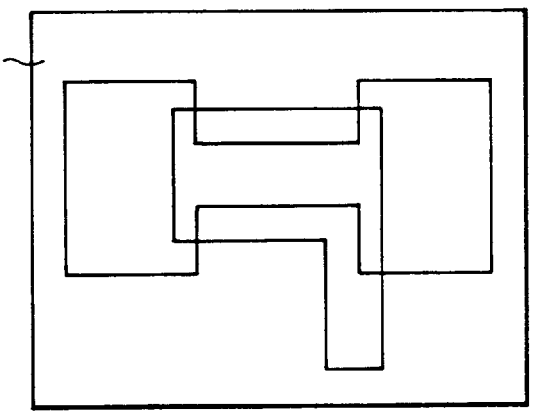
FIG. 10A    FIG. 10B
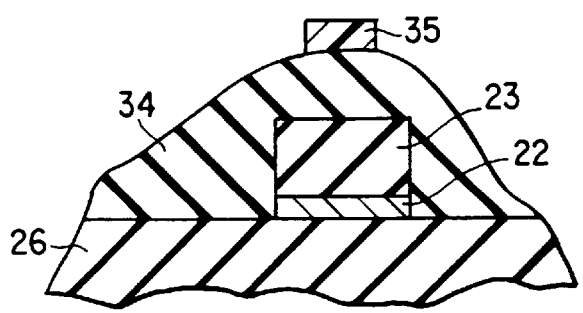 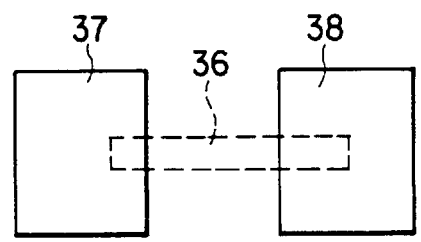
FIG. 11A    FIG. 11B

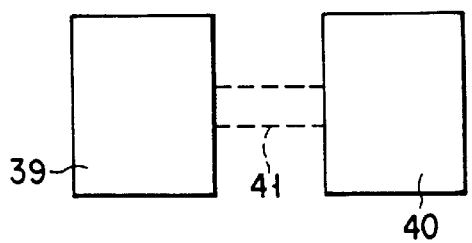
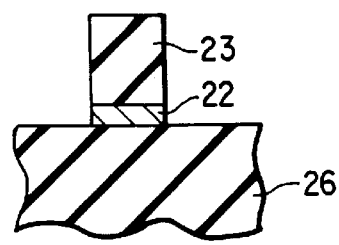
FIG. 12A  FIG. 12B
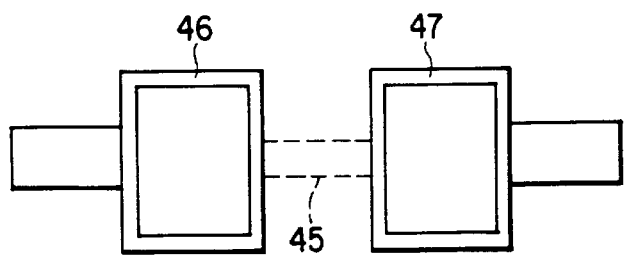
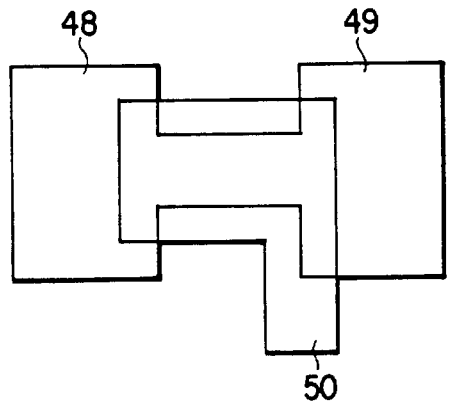
FIG. 13A  FIG. 13B
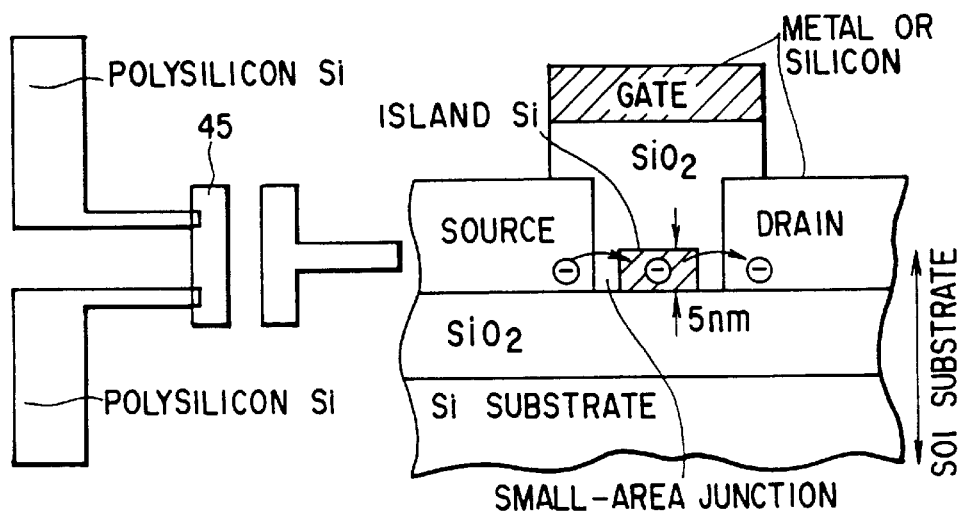
FIG. 14  FIG. 15

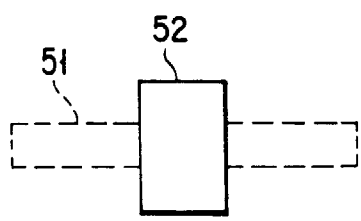
F I G. 16
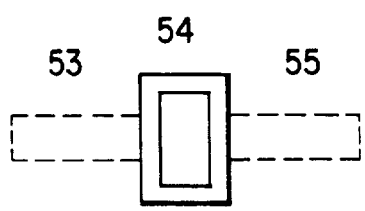
F I G. 17
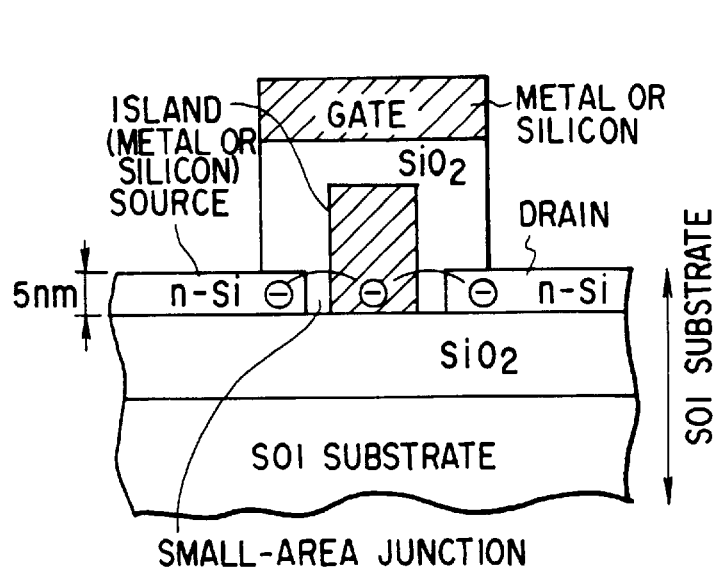
F I G. 18
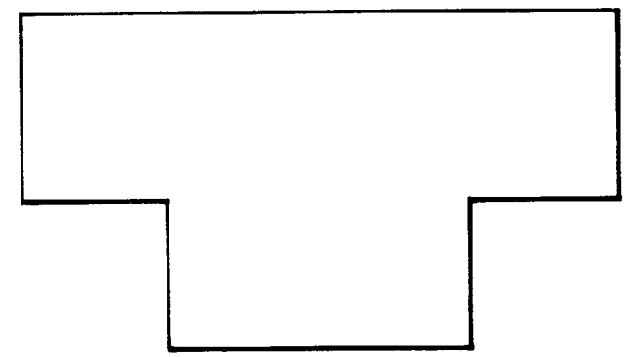
F I G. 19
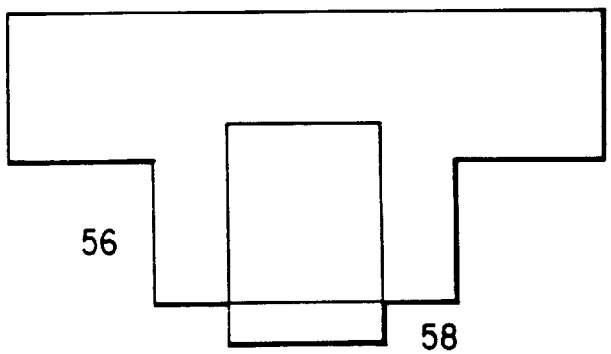
F I G. 20

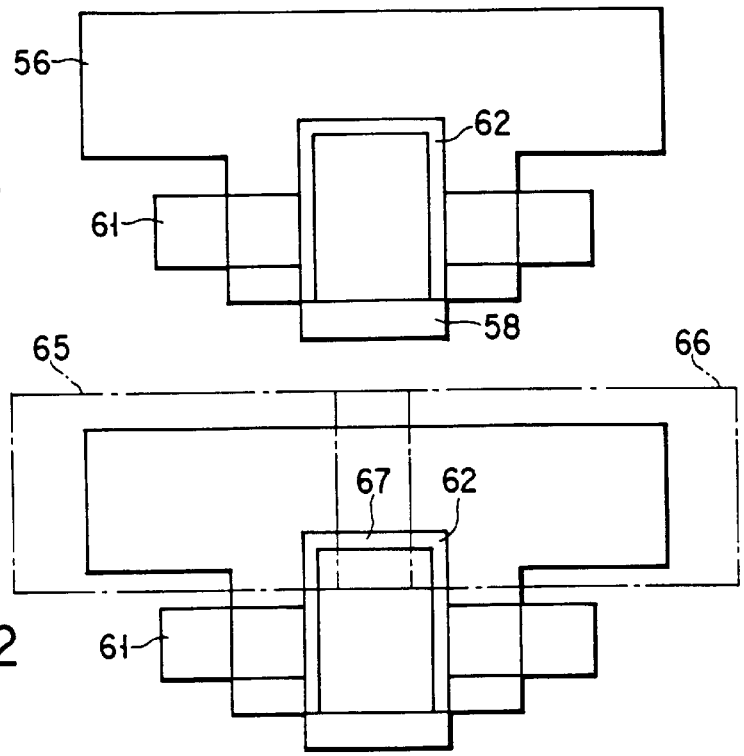
FIG. 21
FIG. 22
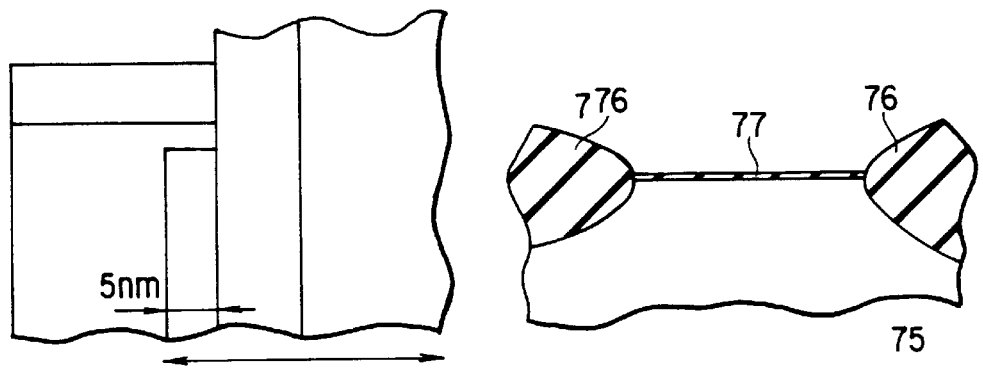
FIG. 23
FIG. 24
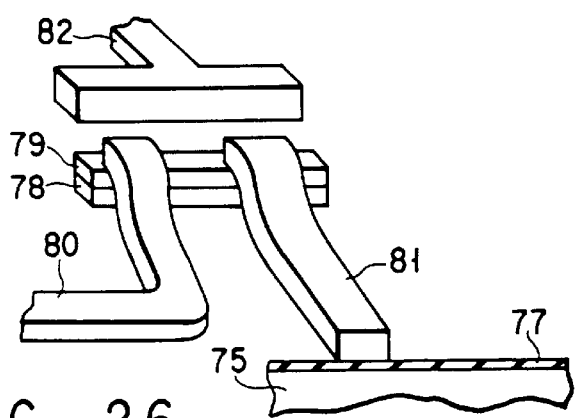
FIG. 26
FIG. 25

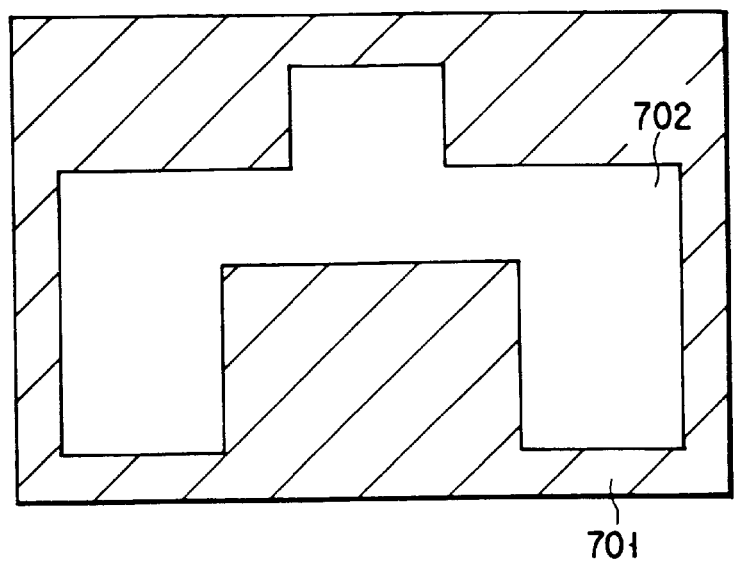
F I G. 32A
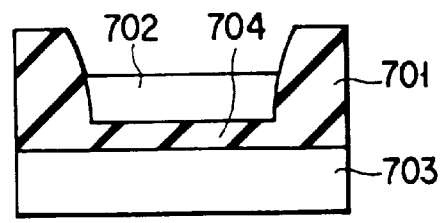
F I G. 32B
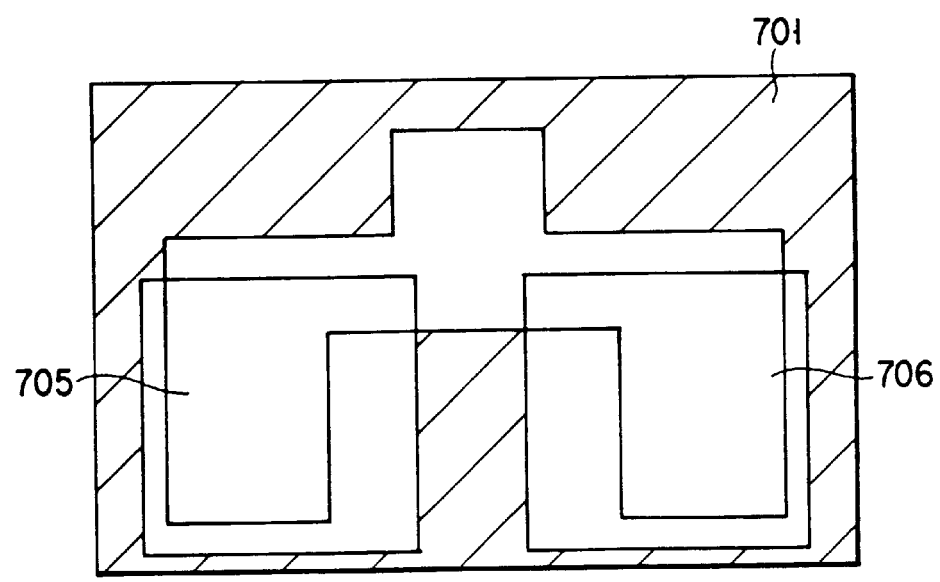
F I G. 33

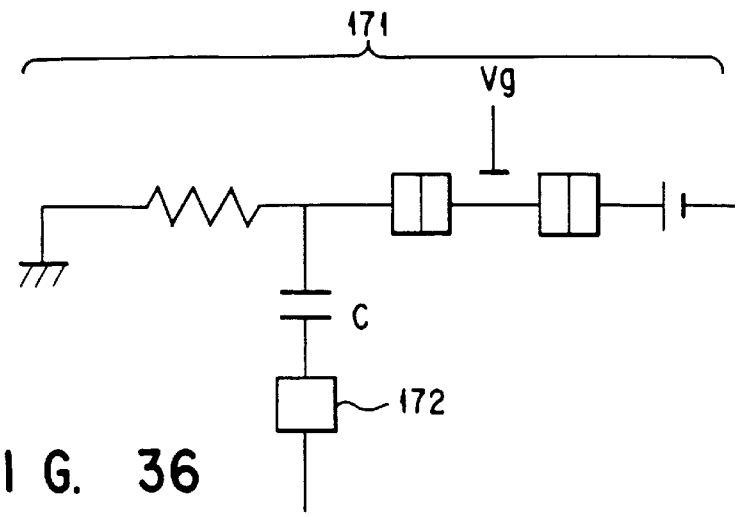
FIG. 36
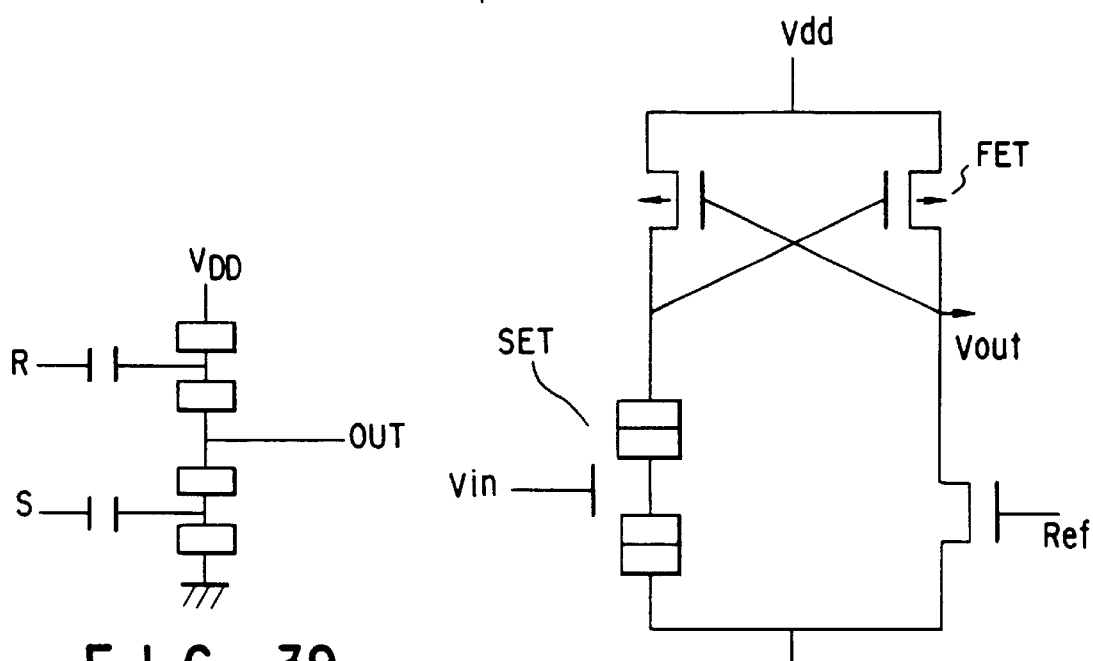
FIG. 39 (PRIOR ART)
FIG. 37
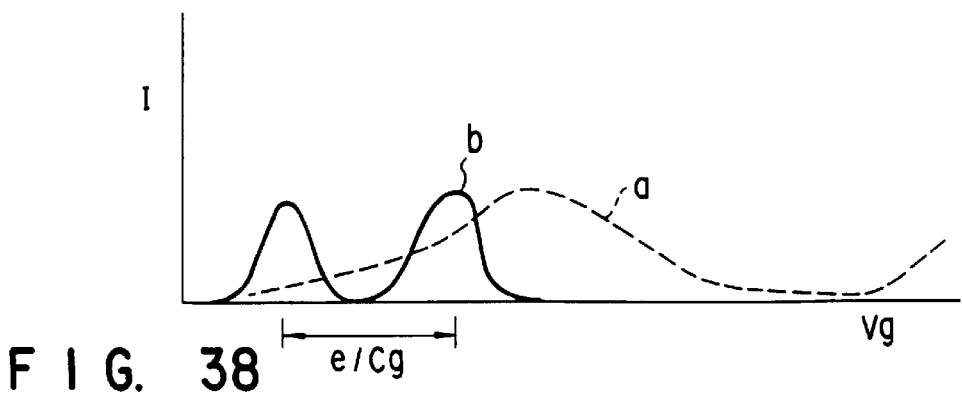
FIG. 38

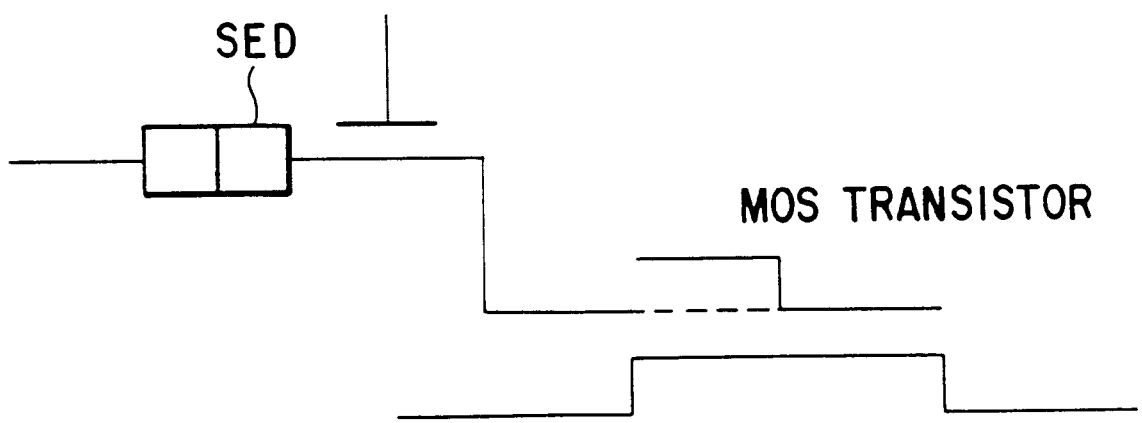
F I G. 40

SEMICONDUCTOR DEVICE

BACKGROUND OF THE INVENTION

1. Field of the Invention

The present invention relates to a semiconductor integrated circuit having a plurality of functional blocks and, more particularly, to a semiconductor integrated circuit comprising a semiconductor device having a tunnel junction which has small capacitance and in which single-electron tunnel effect takes place.

2. Description of the Related Art

Semiconductor integrated circuits such as memories and logic circuits, each comprising MISFETs, are known. Their advancement has been attained by making MISFETs smaller and smaller.

An integrated circuit of this type consumes 1 femtojoule to perform one logic operation. In actual operation, however, it spends as much as 10 femtojoules for one logic operation, because some load is applied to it. Each device incorporated in the circuit consumes 10 microwatts when the clock frequency used is 1 GHz. If the circuit has 100 million logic gates, it will probably consume as much as 1 kilowatt.

MISFETs have been miniaturized to enhance the integration density and operating speed of integrated circuits. It is now difficult to miniaturize MISFETs further for reasons of various problems such as a higher possibility of punch-through and a leakage current through a thin gate electrode.

Furthermore, the operating speed can hardly be increased even if the MISFETs are made much smaller, due to the increased peripheral capacitance of the integrated circuit. Since, each MISFET is now so tiny that only hundreds of electrons are moving to activate the MISFET, even if only one electron is trapped in the gate oxide film, the drain current will change very much, about several tens of percent. Due to this change in the drain current, the MISFET will possibly make errors while operating.

In the course of miniaturization of the device, new phenomena are observed. Novel devices in which new phenomena are positively used have been developed. Among them is a single-electron transistor, or a SET (see IEEE Trans. Magnetics, Vol. MAG-23, pp. 1142–1145). The SET utilizes a phenomenon called "coulomb blockade" which occurs in small tunnel junctions. As shown in FIG. 1, the SET has two tunnel junctions 1 and 2. Current flowing through the tunnel junctions is controlled by a gate capacitive-coupled to an electrode located between the junctions 1 and 2.

It is proposed that the SET be incorporated in the circuit shown in FIG. 28. However, what measures should be taken to enable the SET to detect information has not yet been known.

A voltage controlling SET system is about e/C, where C is the capacitance of the small junctions. Obviously, this voltage is far lower than the power-supply voltage of 3V applied to drive MOS transistors commonly used at present. The current flowing in the SET is 1 nA or less, far less than the current flowing in a MOS transistor. If SETs are incorporated in an LSI together with other types of active devices, such as MOS transistors, there will arise great problems because of the difference between each SET and each other device in terms of control voltage and control current.

The higher the integration density of an integrated circuit, the greater the power consumption of the circuit. How much the integration density can be increased depends, after all, on whether or not heat-related problems can be solved. Even if the heat-related problems are solved, there are other problems hindering further advancement of integrated circuits, such as the limit to the miniaturization of MOSFETs and the limit to the advantage resulting from the miniaturization of MOSFETs.

As mentioned above, no methods have yet to be developed to enable an SET to detect information. The voltage controlling SETs is about e/C. (C is the capacitance of the small junctions which the SET has.) This voltage is order of 1 mV, i.e., the lowest voltage needed for driving the smallest possible device that can be provided by the manufacturing techniques which are available at present.

As indicated above, the power-supply voltage applied to drive MOS transistors commonly used at present is 3V. This voltage will be reduced to 1V when MOS transistors are made smaller to have a 0.1 micron size. As already pointed out, the current flowing in the SET is 1 nA or less, much less than the current that flows in a MOS transistor.

SUMMARY OF THE INVENTION

The object of the present invention is to provide a semiconductor integrated circuit comprising semiconductor devices which are tiny, consuming a little power, and which are not deteriorated in characteristic even if arranged in a high integration density.

According to a first aspect of the invention, there is provided a semiconductor integrated circuit comprising: a first functional block consisting essentially of a first circuit which includes a small junction device; and a second function block consisting essentially of a second circuit which includes a field effect transistor, the second functional block being mutually connected to the first functional block.

According to a second aspect of the invention, there is provided a semiconductor device comprising: a first circuit block including a small junction device; and a second circuit block including a field effect transistor, the second circuit block being arranged around the first circuit block.

According to a third aspect of the present invention, there is provided a semiconductor device comprising: a circuit block including a small tunnel junction device; and a circuit for reading a charge in the small tunnel junction device. The small tunnel junction device has a first electrode and a second electrode for controlling the first electrode, and outputs as data a charge transferred during a predetermined period for which a voltage at the second electrode is swept.

According to a fourth aspect of this invention, there is provided a semiconductor device comprising: a circuit block including a small tunnel junction device; and a circuit for reading a charge in the small tunnel junction device. The small tunnel junction device has a first electrode and a second electrode for controlling the first electrode, and outputs as data a capacitance between the first and second electrodes.

According to a fifth aspect of the present invention, there is provided a semiconductor device comprising: a semiconductor substrate; an insulating layer provided on the semiconductor substrate; a semiconductor layer provided on the insulating layer and having first and second regions; a field-effect transistor provided in the first region of the semiconductor layer; and a single-electron transistor provided in the second region of the semiconductor layer. The single-electron transistor has an intermediate electrode located in the second region of the semiconductor layer. The field-effect transistor includes a source region and a drain region spaced apart from the first region, a channel region located between the source and drain regions and having side walls on both sides thereof, a pair of gate insulating films provided on the side walls of the channel region, respectively, a first gate electrode provided on one of the gate insulating films; and a second gate electrode provided on the other of the gate insulating films.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention and, together with the general description given above and the detailed description of the preferred embodiments given below, serve to explain the principles of the invention.

FIGS. 9A and 9B are a sectional view and a plan view, explaining how a thin SOI layer is patterned to form thin wires;

FIG. 10A is a sectional view showing an $SiO_2$ layer and an Si layer etched, forming a SOI wire on a single-electron transistor;

FIG. 10B is a plan view illustrating the masks for use in forming n-type MOSFETs in the fourth embodiment;

FIGS. 11A and 11B are a sectional view and a plan view, explaining how a polysilicon electrode is formed to be connected to the source and drain of each single-electron transistor incorporated in the fourth embodiment;

FIGS. 12A and 12B are a plan view and a sectional view, showing an silicon layer and an $SiO_2$ layer, both etched by using the resist shown in FIGS. 11A and 11B;

FIGS. 13A and 13B are a plan view of a single-electron transistor and a plan view of an n-type MOSFET, each having polysilicon source and drain electrodes formed on the sides of an opening of an Si layer;

FIG. 14 is a diagram showing a single-electron transistor having an intermediate electrode made of an SOI layer and a lead electrode made of polysilicon;

FIG. 15 is a sectional view showing one of the single-electron transistors incorporated in the fourth embodiment, each having an intermediate electrode made of a thin SOI layer;

FIG. 16 shows one of the trenches in which intermediate electrode are formed after wires are formed of a thin SOI layer in the manufacture of an integrated circuit according to a fifth embodiment of the invention;

FIG. 17 is a diagram showing the polysilicon electrode formed on the side of the trench shown in FIG. 16;

FIG. 18 is a sectional view showing a single-electron transistor whose source and drain electrodes are made of thin SOI layers;

FIG. 19 shows a mask for use in forming an SDG region by LOCOS method in an integrated circuit according to a sixth embodiment of this invention;

FIG. 20 shows a mask for use in making a trench to form the channel region of each MOSFET incorporated in the sixth embodiment;

FIG. 21 is a diagram showing the gate electrode and lead electrode of each MOSFET incorporated in the sixth embodiment;

FIG. 22 shows a mask used to implant $n^+$ ions to form the source and drain of MOSFET incorporated in the sixth embodiment;

FIG. 23 is a sectional view of each MOSFET incorporated in the sixth embodiment;

FIGS. 24 to 26 are diagrams explaining a method of manufacturing an integrated circuit according to a seventh embodiment of the present invention;

FIGS. 32A and 32B are a plan view and a sectional view, explaining how active regions and an oxide film are formed in the manufacture of an integrated circuit according to a twelfth embodiment of the invention;

FIG. 33 is a plan view explaining how source and drain regions are formed in producing FETs included in the integrated circuit;

FIG. 36 is a circuit diagram corresponding to a block diagram of FIG. 30;

FIG. 37 is a circuit diagram showing a device according to an eleventh embodiment of the present invention;

FIG. 38 is a graph showing a relation between a current flowing through SED and a gate voltage;

FIG. 39 is a circuit diagram showing a semiconductor device comprising two single-electron transistors; and FIG. 40 is a circuit diagram showing a semiconductor device comprising one single-electron transistor.

DETAILED DESCRIPTION OF THE PREFERRED EMBODIMENTS

Figure 1:
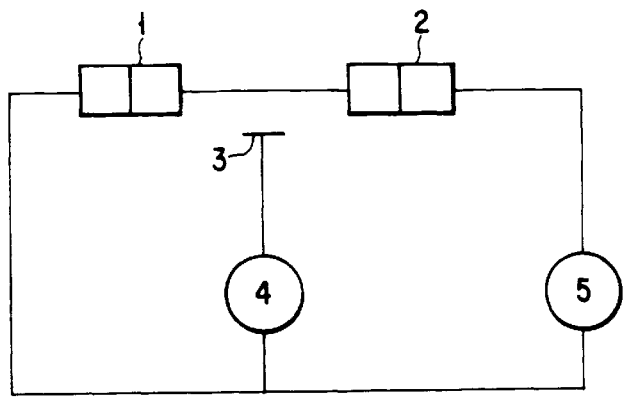
FIG. 1 is a circuit diagram showing a single-electron transistor.

A semiconductor integrated circuit according to a first aspect of the invention comprises a first circuit block including a small tunnel junction device, and a second circuit block a field effect transistor. The second circuit block is mutually connected to the first circuit block.

Single-electron transistors are liable to be affected by noise because the current flowing in the single-electron transistors is in the order of nA, and the voltage applied thereof is in the order of mV. Nonetheless, by connecting input/output section including a field-effect transistor to the second circuit block arranged around the first circuit block, the single-electron transistors incorporated in the first circuit block are free from the influence of the voltage (several volts) operating the field-effect transistor. They are hardly affected by the noise which the external circuit may generate. Hence, the integrated circuit can operate stably. In other words, the integrated circuit can be provided in the form of a noise-free, high-efficiency LSI.

An integrated circuit according to the second aspect of the invention comprises two circuit blocks. The first circuit block includes a single-electron transistor having a small tunnel-junction. The second circuit block is arranged around the first circuit block and includes field-effect transistors.

Thus, the single-electron transistors are isolated from the external circuit and is free from the influence of the external noise.

The first circuit block and the second circuit block can be provided on the same substrate. If so, an insulating layer is provided on the substrate and conductive layers are provided on the insulating layer and used as the electrodes of the single-electron transistors. Further, an insulating film is provided on each conductive layer, serving as the tunnel insulating film of one single-electron transistor, i.e., a tunnel-junction device.

A signal converter may connects the first circuit block to the second circuit block. The converter is, for example, a differential amplifier which comprises MISFETs and field-effect transistors. Each field-effect transistor has an additional electrode provided in the source-side portion of the gate insulating film. This electrode is connected to one single-electron transistor.

The second circuit block has an input/output section which is connected to the external circuit. The input/output section may comprise field-effect transistors. Alternatively, the integrated circuit may have an input/output section connected to the second circuit block, not built in the second circuit block.

The integrated circuit may further comprise a cell section and a data input/output circuit. The cell section has a main cell and a dummy cell. The data input/output section is designed to output data representing the difference between the voltage across the main cell and the voltage across the dummy cell. More precisely, the data input/output has a differential amplifier which detects a difference between the voltage across the dummy cell (i.e., a reference voltage) and the output voltage of each single-electron transistor (i.e., the voltage on the main cell). This difference is the infinitesimal voltage one single-electron transistor outputs.

The integrated circuit according to the first aspect of this invention may be modified in various ways, providing the following modifications:

1. A circuit in which at least one of the electrodes of each single-electron transistor is formed of a SOI (Silicon On Insulation) layer provided on the Si substrate and having a thickness of 50 nm or less.

2. A circuit in which each MISFET included in the second circuit block has a channel width which is the thickness of the SOI layer on the Si substrate and a gate electrode provided on an insulating layer formed on the side wall of the substrate, not on an $SiO_2$ layer located above the substrate.

3. A circuit in which the tunnel junctions of each single-electron transistor are connected in series, the gate insulating film of each field-effect transistor of the second circuit block includes an electrode connected to one single-electron transistor, and an electrode is capacitor-coupled with the tunnel junctions to input and output data.

4. A circuit in which an electrode is formed in the gate insulating film of each field-effect transistor included in the signal converter and connected to one single-electron transistor, and either tunnel junction has capacitance C satisfying the requirement of $e^2/2C > K_B T$, where $K_B$ is Boltzmann factor.

5. A circuit in which first and second electrodes are formed in the gate insulating film of each field-effect transistor included in the signal converter, the second electrode is connected to one single-electron transistor, and the second electrode and the substrate have capacitance $C_g$ greater than the capacitance C of the tunnel junctions connected to the first electrode.

The principles of the integrated circuit will be described.

First, the power consumption of the single-electron transistor shown in FIG. 1 will be calculated. This transistor has a delay time which is given as $R_i C$. Here, Ri is the tunnel resistance and C is the capacitance. The capacitance C is 3 aF for metal, assuming that each tunnel junction has an area of 10 nm×10 nm, the capacitance C is 3 aF. It is required that the resistance $R_i$ be much higher than quantum resistance (=25 KΩ). In the present device, the resistance $R_i$ is set at 100 KΩ. Thus, the delay time the single-electron transistor is 0.3 picosecond. Since coulomb blockade occurs in the tunnel junctions 1 and 2, the voltage controlling the single-electron transistor is e/2C, or 25 mV. To compensate for a logic swing, the voltage is set at 50 mV. As a result, energy for switching the transistor by one electron is 8×10−21 joule, which is about 25 nW. In other words, the single-electron transistor consumes 25 nW to perform switching operation. It follows that an integrated circuit having an integration of 100 mega gates and driven at clock frequency of 1 GHz consumes but only 0.8 mW per one chip.

In the single-electron transistor, the behavior of one electron is controlled. To control one electrode, both tunnel junctions only need to have a infinitesimal area each. Hence, the single-electron transistor can be made much smaller than the conventional semiconductor devices.

The current flowing in the single-electron transistor is 1 nA or less, far less than the current flowing in a conventional device such as a MOS transistor. A voltage which can be applied between the source and drain of the single-electron transistor is theoretically e/2C or less. The voltage increases with temperature. At room temperature, it is 25 mV. A 10-times temperature tolerance may be imparted to the single-electron transistor. In this case, the voltage is still only 250 mV even if the capacitance C is considerably small.

Some of the CMOS functional blocks provided in an integrated circuit consume more power than the other blocks and can be constituted by smaller devices. If single-electron transistors are used in place of the MOS transistors in such functional blocks, the integrated will consume but far less power and will become more compact, with an increased integration density.

Here arises a problem. Any circuit block comprising single-electron transistors cannot be connected directly to any circuit block comprising MOS transistors. This is because the voltage applied to MOS transistors is several volts (never less than about 1V), while the voltage applied to single-electron transistors (SETs) is 250 mV or less. Signal converters must be used to connect the SET functional blocks to the CMOS circuit blocks. If connected by a signal converter to bear a share of the functions, a SET functional blocks and a CMOS blocks will make up for each other's disadvantage, thus constituting a high-efficiency, high-density integrated circuit which can operate at a low power consumption.

Figure 2:
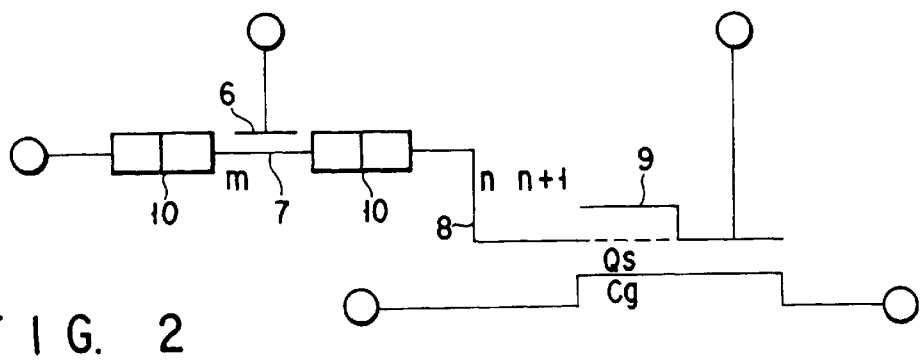
FIG. 2 is a circuit diagram of a semiconductor device comprising a MOS transistor and a single-electron transistor.

In a preferred embodiment of the invention, a single-electron transistor may be connected to a MOS transistor by an electrode which is provided in the oxide film of the MOS transistor. To be more specific, as shown in FIG. 2, an electrode 8 is formed in the oxide film of a MOS transistor. That end of the electrode 8 which is connected to the MOS transistor is set at an electric charge $Q_s$ of the following value:

$$Q_s = V_g \times 1/(2/C + 1/C_g) + (me/C + 2ne/C)/(2/C + 1/C_g)$$

where n is the number of electrons accumulated in the electrode 8, C is the capacitance of either tunnel junction of the single-electron transistor, $C_g$ is the capacitance between the electrode 8 and the MOS transistor, and $V_g$ is the voltage applied to the electrode 6 located between the tunnel junctions of the single-electron transistor.

Assume that the number of electrons accumulated in the electrode 8 changes from n to n+1, due to the voltage applied from the electrode 6. The charge $Q_s$ will then change to $2eC_g/(2C_g+C)$. If $C_g > C$, the charge Qs changes by about e. For a MOSFET, a device widely used at present, it is difficult to modulate a current high level enough to be detected. Therefore, a voltage is applied to the gate 9 of the MOS transistor, the voltage being almost high enough to invert the channel region of the MOS transistor and not to lower the potential barrier at the source of the MOS transistor. The current flowing in the MOSFET can thereby be changed greatly only if the charge on the electrode 8 is changed a little. This is a phenomenon similar to the phenomenon that a MOSFET held at the sub-threshold level is turned on or off when only one electron is trapped in its very narrow channel. Two semiconductor devices identical to the device shown in FIG. 2 may be connected in series, and the difference between the output currents of the MOSFETs may be output, thereby detecting the current flowing in either MOSFET.

The single-electron transistor has a problem. Its characteristics change due to the fixed charge existing near the intermediate electrode. In order to solve this problems, the change in the polarization between the intermediate electrode and gate electrode of the MOSFET before and after voltage is applied to the gate electrode can be read as an information, thus constituting a circuit free from the influence of the fixed charge.

Furthermore, when the gate voltage of the MOSFET is swept at a constant speed, and an initial value and a final value is set, the current flowing in the single-electron transistor does not vary at all even if a fixed charge exists, provided that the tunnel resistance Ri of the single-electron transistor remains unchanged. In this case, too, the circuit is free from the influence of a fixed charge.

Alternatively, a period of ON-OFF of the single-electron transistor depends upon the capacitance between the single-electron transistor and the gate electrode of the MOSFET. The period is not changed by a fixed charge. Thus, where the capacitance is used as an information the circuit is free from the influence of a fixed charge.

Furthermore, the first and second circuit may be formed on the same substrate, and a second gate may be provided on that side of the substrate which faces away the device whose channel is formed in one surface of a SOI film. The second gate is used to control the channel current of the device. The device can therefore be turned on or off when a very low voltage is applied to the second gate electrode.

Though the signal-electron transistor and the field-effect transistor have a different operation principle from each other, they are interchangeable. Therefore, the circuit shown can be manufactured by forming the MOS transistor first and then the single-electron transistor, on the same manufacturing line.

In the above description, the second circuit block may comprise HEMT. Materials constituting the substrate and the conductive film may be metal, superconductor, or polycrystalline silicon.

Various embodiments of the present invention will be described in detail, with reference to the accompanying drawings.

First Embodiment

Figure 3:
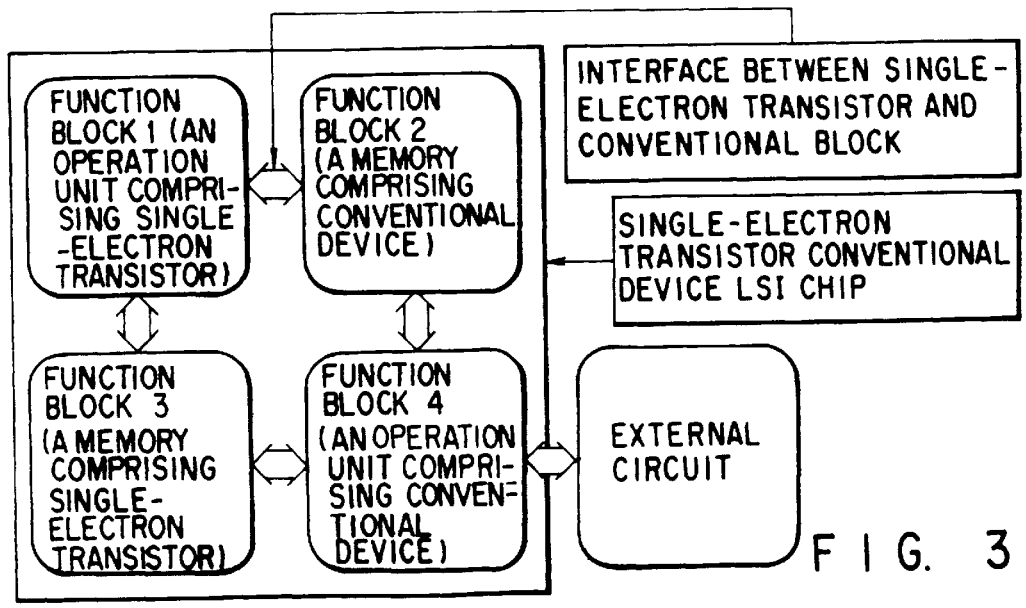
FIG. 3 is a block diagram illustrating an integrated circuit according to a first embodiment of the present invention.

FIG. 3 shows an integrated circuit according to the first embodiment of this invention. As seen from FIG. 3, the integrated circuit comprises four functional blocks 1 to 4. The first block 1 is an operation unit, incorporating single-electron transistors and using an operation unit. The second block 2 is a memory, comprising HEMT (High Electron Mobility Transistor) which is a conventional semiconductor devices. The third block 3 is also a memory, comprising single-electron transistors. The fourth block 4 is an operation unit, incorporating HEMT. The functional blocks 1 to 4 are provided in the form of an LSI chip.

The first functional block 1 and the second functional block 2 are connected by an interface, and data can be transferred between the blocks 1 and 2. Further, the first functional block 1 and the third functional block 3 are connected, whereby data can be transferred between the blocks 1 and 3. Similarly, the second functional block 2 and the fourth functional block 4 are connected, whereby data can be transferred between the blocks 2 and 4. Also, the third functional block 3 and the fourth functional block 4 are connected, whereby data can be transferred between the blocks 3 and 4. Furthermore, the input/output terminals of the fourth functional block 4 are connected to an external circuit. Data can therefore be transferred between the block 4 and the external circuit.

Comprising single-electron transistors which are very small and which consume very little power, the first functional block 1 and the third functional block 3 can be small and operate at low power consumption. The integrated circuit, as a whole, can therefore be smaller and consume less power than otherwise.

As described above, the optimized functional blocks are organically connected, and is connected directly to the external circuit through the conventional devices. The data generated in the integrated circuit can be input to the conventional circuit, and the data generated in the external circuit can be input to the integrated circuit.

Second Embodiment

An integrated circuit according to the second embodiment of the invention will be described. The second embodiment is identical to the first, except that the functional blocks 2 and 4 comprise MOSFETs, not HEMTs. Since the blocks 2 and 4 comprise MOSFETs, the second embodiment can find a broader use in various kinds of apparatuses. If the input/output section of the integrated circuit, which is connected to the external circuit, is composed of MOSFETs, the properly matched integrated circuit can be obtained.

Third Embodiment

Figure 4:
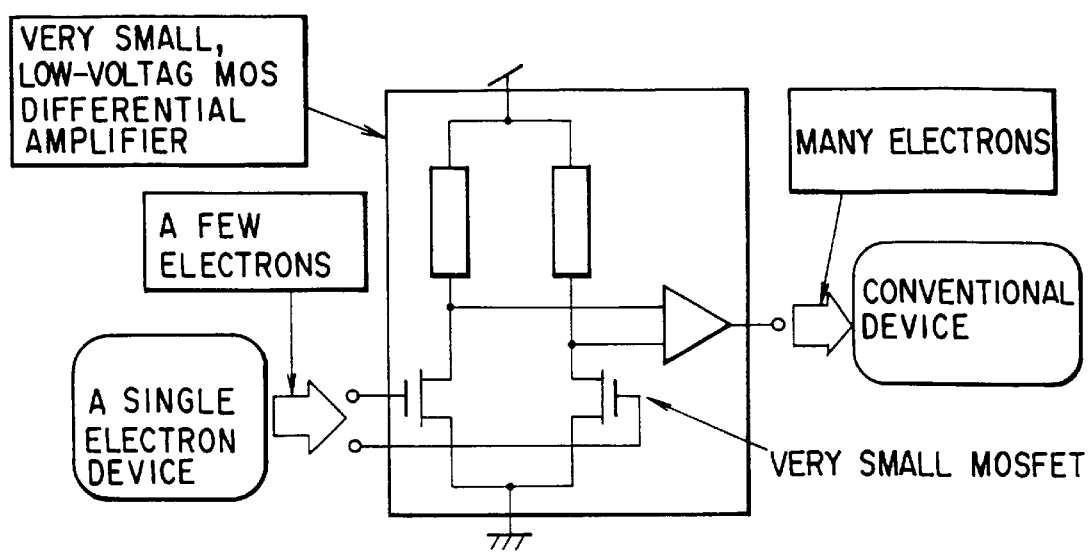
FIG. 4 is a diagram showing the signal converter used in a third embodiment of the invention, which connects a single-electron device to a conventional device.

An integrated circuit according to the third embodiment of the invention will be described, with reference to FIG. 4. The third embodiment is similar to the first embodiment (FIG. 3), but further comprises signal converters. Each signal converter has the structure shown in FIG. 4. The converter is a very small MOS amplifier. The MOS differential amplifier operates at a low voltage, connecting a single-electron device to a conventional device. The signal converter may be any other type of an amplifier. Whichever type of signal converters it has, the third embodiment consumes but a small amount of power because it needs to have only a few signal converters.

The signal voltage drop for output by each conventional device can be performed by known method such as capacitance division. Thus, the output signals of the conventional device can be transferred via the signal converter to the single-electron devices which operate at only a few millivolts to tens of millivolts.

Thus, even if the integrated circuit comprises functional blocks which operate at a different signal level, the signal converters connect these functional blocks, so to speak, organically. Therefore, the third embodiment can be an integrated circuit which is tiny and which operate at a very low power consumption.

Fourth Embodiment

An integrated circuit according to the fourth embodiment of this invention will be described, with reference to FIG. 5 to 8. The fourth embodiment is an integrated circuit comprising MOSFETs and single-electron transistors (SETs) which are formed on the same SOI substrate. The MOSFETs are of very thin SOI (Silicon On Insulation) structure. Each SET comprises two small junctions, an intermediate electrode. An electrode connected to a source and drain is formed of poly-Si. The intermediate electrode is interposed between the small junctions and is made of a SOI layer thinner than the MOSFETs.

Very thin SOI layers to be used as the active regions of the MOSFETs, and thin n-type SOI layers to be used as the intermediate electrodes of the SETs are formed in the following method.

At first, a SOI substrate is prepared which consists of a buried oxide layer having a thickness of 80 nm and an Si layer formed on the buried oxide layer and having a thickness of 180 nm. Then, a dummy thermal oxide film, 100 nm thick, is formed on the SOI substrate. The resultant structure is treated with ammonium fluoride, removing the oxide film. A thermal oxide film, 70 nm thick, is formed on the SOI substrate. Ammonium fluoride is again applied, thereby removing the thermal oxide film.

Figure 5:
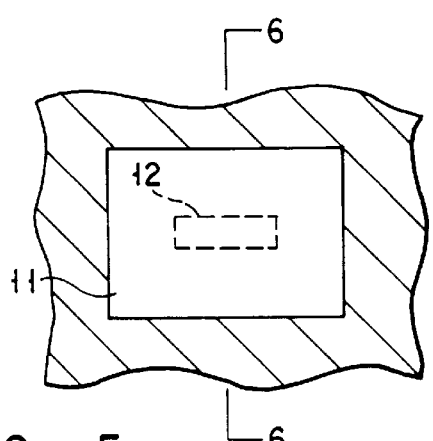
FIG. 5 is a sectional view showing the structure with a resist pattern.

Thereafter, another dummy thermal oxide film, also 100 nm thick, is formed on the SOI substrate. An SiN film is deposited on the resultant structure, to a thickness of about 100 nm. A resist is coated on the SiN film. The resist is patterned into a resist pattern, which exposes those parts of the SiN film in which no SETs will be formed. FIG. 5 shows a part of the resist pattern 11. The rectangle 12 in FIG. 5 is that portion of the Si layer in which the intermediate electrode of a SET will be formed.

Figure 6:
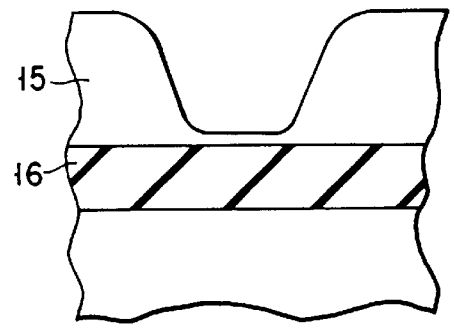
FIG. 6 is a sectional view, taken along line 5—5 in FIG. 5.

Using the resist pattern 11 as mask, the SiN film is etched in part, forming an SiN pattern. The resist pattern 11 is removed. The Si layer is then subjected to selective oxidation, by using the SiN pattern as a mask. Those portions of the Si layer which are exposed via the openings of the SiN pattern are etched to a thickness of about 70 nm. Next, the SiN pattern is removed by means of CDE. The resultant structure is etched with ammonium fluoride, thus removing the thermal oxide film. Further, the Si layer 15 is exposed as illustrated in FIG. 6. As a result, very thin SOI layers are formed. These SOI layers, i.e., the intermediate electrodes of SETs, need not be as thick as SOI layers, i.e., the active regions of the MOSFETs.

Next, a resist pattern is formed on the resultant structure, exposing those portions of the Si layer which will be the intermediate electrodes of the SETs. Phosphorus ions are implanted at an acceleration voltage of 60 KeV, into said portions of the Si layer. N-type layers having a sufficiently high impurity concentration are thereby provided.

The n-type layers may have a low impurity concentration, instead. In this case, the capacitance of a depletion layer is connected in series to the small junctions of one SET which are connected to the intermediate electrode. The sum of the capacitance of the depletion layer and the capacitances of the small junctions is responsible for coulomb blockade. The sum of these capacitances can be reduced, without changing the tunnel resistance of the SET. This is a desirable phenomenon.

Alternatively, the n-type layers may be of the type which becomes an inversion layer when applied with a gate voltage, provided that the SOI substrate is a p-type one. In this case, that part of the intermediate electrode which is not an inversion layer is frozen out at low temperatures, becoming an insulator. The capacitances of the small junctions therefore decreases.

It will now be explained how MOSFETs are formed in the SOI layer, with reference to FIGS. 7 to 15.

Figure 7:
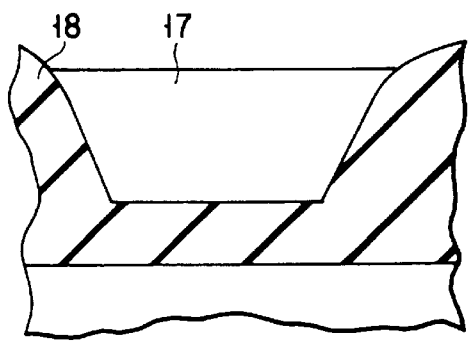
FIG. 7 is a sectional view of the structure shown in FIG. 6, with an oxide film made by LOCOS method.
Figure 8:
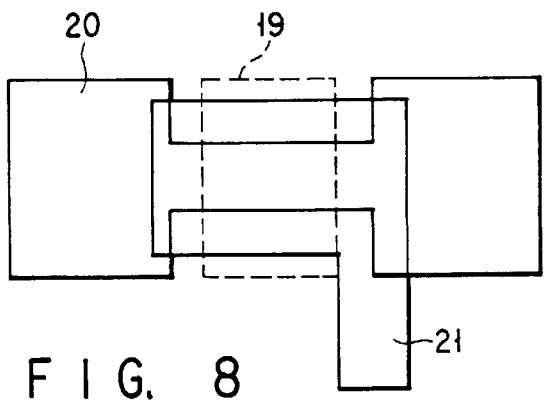
FIG. 8 is a plan view of one of the MOSFETs incorporated in the fourth embodiment.

First, the wafer having very thin SOI layers, thus formed, is oxidized to have an oxide layer having a thickness of about 50 nm. Then, as shown in FIG. 7, SDG regions 17 and device-isolating regions 18 are formed by ordinary LOCOS (Local Oxidation of Silicon) method. A gate oxide film is formed to a thickness of 10 nm, and a polysilicon layer is deposited. The polysilicon layer is patterned, forming polysilicon pattern which will be used as the gates of the MOSFETs. Next, using the polysilicon pattern as mask, arsenic ions are implanted into the resultant structure, thereby forming the source and drain of the MOSFETS. Very thin SOI-MOSFETs are thereby formed in the the SOI layer, as illustrated in FIG. 8. In FIG. 8, the SDG region and gate electrode of each SOI-MOSFET are designated at numerals 20 and 21, respectively.

Now it will now be explained how SETs are formed in the wafer in which MOSFETs have been formed as described above.

At first, as shown in FIG. 9A, a $SiO_2$ film 23 having a thickness of 20 nm is deposited on the Si layer 22 formed on the wafer thus processed and having a thickness of about 5 nm. A resist is coated on the $SiO_2$ film 23 and subjected to patterning, forming a resist pattern 24. The resist pattern 24 is so shaped as to form intermediate electrodes of SETs. Then, the $SiO_2$ film 23 is first etched and the Si layer 22 is then etched by using the resist pattern 24 as mask, thereby forming wires 25 having a width of 0.1 μm as illustrated in FIG. 9B. Meanwhile, as shown in FIGS. 10A and 10B, are used, patterning the Si layer 22 and the $SiO_2$ film 23 already provided, one upon another, on the oxide underlayer 26, is patterned using resist patterns 29 and 30 as masks so as to leave the gate electrode, source and drain and channel region of the MOSFE.

As shown in FIGS. 11A and 11B, a $SiO_2$ film 34 having a thickness of 200 nm is deposited on the resultant structure. Using a resist pattern 35 as a mask, the $SiO_2$ film 34, i.e., a very thin SOI layer, is etched, forming intermediate electrodes 36 which have a length of 0.3 μm.

Next, as illustrated in FIGS. 12A and 12B, the SiO$_2$ film 23 and the Si layer 22 are etched in part, by using the resist pattern 35 as a mask until the selected portions of the oxide underlayer 26 are exposed. In FIGS. 11A, 11B and 12A and 12B, numerals 37, 38, 38 and 40 denote trenches, and numerals 36 and 41 designate very thin SOI wires.

The resultant structure is subjected to ordinary etching process or KOH etching, thereby exposing the (111) face, in order to form tunnel insulating films on the exposed parts of the Si layer. Then, the structure is subjected to thermal oxidation, forming a thermal oxide film having a thickness of 1 to 2 nm. Instead of the thermal oxide film, a deposited oxide film or a nitride film may be formed. A phosphorus-doped polysilicon layer is deposited on the structure and then activated. The polysilicon layer is etched in part, leaving polysilicon layers 46 and 47 on the side walls of the openings of the Si layer as is illustrated in FIGS. 13A and 13B.

An insulating film is deposited on the resultant structure, and a polysilicon layer is deposited on the insulating film. The polysilicon layer is patterned, forming gate 50 as shown in FIG. 13B. As a result, SET are made. Instead, the gate can be made of metal. They may be formed at the same time the gate of the MOSFET or the lead-out electrode of the SET is formed. The lead-out electrode of SET (i.e., the polysilicon layers 46 and 47) may be formed by patterning, not on the sides of the openings of the SI layer, as is illustrated in FIG. 14. In FIGS. 13A and 13B, numeral 45 designates a thin SOI wire, and numerals 48 and 49 represent SET regions.

Finally, an inter-layer insulating film is deposited on the MOSFET and the SET, contact holes are made in the insulating film, and an aluminum interconnection is formed in the contact holes and on the insulating film. As a result of this, an integrated circuits is manufactured which comprises MOSFET and SET, all formed on the same Si substrate.

FIG. 15 is a cross-sectional view of each SET thus made. As seen from FIG. 15, the SET is very small and can be formed on the same substrate, together with Si-MOSFETs.

In the fourth embodiment, the SET can be made without using silicon, in the same method as described above. They can be made of metal (e.g., Al) or a super-conductive material, in which the motion of a single electron can be controlled. Alternatively, they can be made of polysilicon.

As mentioned above, the substrate of the fourth embodiment is a SOI substrate. Instead, a bulk silicon substrate may be used instead. If so, MOSFET is first formed on the bulk silicon substrate by the ordinary method, and a layer of single crystal silicon is then formed on a field oxide film by solid-phase epitaxial growth. In this case, the single crystal silicon layer may be used as the electrodes of SETs, whereby the integrated circuit comprising the MOSFETs and the SETs can be rendered still smaller.

Fifth Embodiment

An integrated circuit according to the fifth embodiment of this invention will be described, with reference to FIG. 16, 17 and 18. The fifth embodiment is characterized in that the electrode of SET, which is connected to the source and drain, is made of a thin SOI layer and that the intermediate electrode of each SET is made of polysilicon. How the SETs are made will be explained.

After MOSFETs have been made in a thin SOI layer in the same way as in the fourth embodiment, a thin wire having a width of about 0.1 μm is formed as shown in FIG. 12A and 12B. Next, a SiO$_2$ film is deposited and openings 52 is made in the SiO$_2$ film as shown in FIG. 16, exposing some parts of the Si layer. A thin tunnel oxide film is formed on each exposed part of the Si layer. To mitigate the damage resulting from etching process, a dummy oxide film may be first formed and removed, and an oxide film may then be formed on the exposed part of the Si layer, or an oxide film may be formed after clean (111) face is exposed by means of KOH etching or the like. In FIG. 16, numeral 51 denotes the slender portions of the thin SOI layer.

Thereafter, a phosphorus-doped polysilicon layer is deposited and activated subsequently. This polysilicon layer is etched in such a manner as shown in FIG. 17, leaving a polysilicon layer on the sides of opening of the Si layer. The polysilicon layer is used as the intermediate electrode. In FIG. 17, numerals 53 and 55 designate the slender portions of the thin SOI layer.

After forming thin wires of the type shown in FIGS. 12A and 12B, the resultant structure is subjected to thermal oxidation or the like. The thin wires are thereby made thinner, whereby junctions having a small area are provided.

Next, an insulating film is deposited on the structure, and a polysilicon layer is deposited on the insulating film. The polysilicon layer are patterned, forming the gates for SETs. As a result, SETs are made. The gates can be made of metal, instead, as in the fourth embodiment. They may be formed at the same time the gate of the MOSFET or the lead-out electrode of the SET are formed. The SET thus made has the structure shown in FIG. 18. As can be understood from FIG. 18, the SET is very small and can be formed on the same substrate, together with Si-MOSFET of almost all types known.

Sixth Embodiment

An integrated circuit according to the sixth embodiment of the present invention will be described, with reference to FIG. 19 to 23. The sixth embodiment is manufactured in the same way as the fourth embodiment, except for the following respects.

After a thin SOI layer is formed at the channel region of each MOSFET, an SDG region 56 is formed by ordinary LOCOS method as is illustrated in FIG. 19. An SiO$_2$ film is deposited on the SDG region 56, to a thickness of 400 nm. As shown in FIG. 20, a resist is patterned in accordance with a trench pattern, forming a resist pattern. Using the resist pattern as a mask, the SiO$_2$ film and the Si layer are etched to form an opening.

A polysilicon layer is deposited on the resultant structure, and phosphorus is diffused into the polysilicon layer. The polysilicon layer is etched, leaving a polysilicon layer on the sides of the opening of the Si layer to form a gate electrode 62 as shown in FIG. 21. In FIG. 21, numeral 61 is a lead-out electrode which is connected to the gate electrode 62.

A resist is formed on the resultant structure as shown in FIG. 22. Openings are made in the resist, exposing those portions of the structure which will be the sources and drains of MOSFET. Namely, the resist is processed into resist patterns 65 and 66. Using the resist patterns 65 and 66, arsenic ions are implanted to said portions of the structure, thereby forming a source and drain. Thereafter, contact hole is made by the known method, and aluminum wire is formed in the contact hole and on some components of the structure. As a result, MOSFET is made having a very narrow channel.

Each MOSFET thus made has a channel located in the specific region shown in FIG. 23. Obviously, the channel region of the MOSFET is very thin and narrow. The MOSFET can therefore operate at very high speed and can have high mutual conductance with the gate. The method of manufacturing MOSFET, described above, is compatible with the method of manufacturing single-electron transistors. The devices composing the functional blocks similar to the blocks 1 to 4 of the first embodiment can be easily manufactured.

Seventh Embodiment

An integrated circuit according to the seventh embodiment of this invention will be described, with reference to FIGS. 24, 25 and 26. The seventh embodiment is manufactured in the following method.

First, as shown in FIG. 24, an oxide film 76 is formed on a p-type silicon substrate 75 by LOCOS method, using an SiN mask. An $SiO_2$ having a thickness of 5 nm is then formed to form MOS channels. Next, a polysilicon film 87 is deposited to a thickness of 5 nm by means of LPCVD method. Further, an $SiO_2$ film 79 is deposited by CVD method. The $SiO_2$ film 79 is patterned as shown in FIG. 25, forming intermediate electrodes constituting small junctions.

Phosphorus is diffused into the polysilicon layer 78 at 850° C. for 15 minutes. Oxidized portions of the polysilicon layer 78 are removed by applying ammonium fluoride. Next, the remaining portions of the layer 78 are oxidized at 850° C. for about 30 seconds, thereby forming insulating films for the small junctions. A polysilicon film is deposited to a thickness of about 100 nm. Phosphorus is diffused into the polysilicon film at 850° C for about 20 minutes. Oxidized portions of this polysilicon film are removed by applying ammonium fluoride.

Next, as shown in FIG. 26, the polysilicon film are patterned, forming an electrode 80, a gate 82 and an electrode 81 which compose one small junction. The electrode 81 is formed in a MOS insulating layer. An $SiO_2$ film having a thickness of 50 nm is deposited by CVD method, and a polysilicon layer having a thickness of 200 nm is deposited on the $SiO_2$ film by LPCVD method. Phosphorus is diffused into the polysilicon layer at 850° C. for 30 minutes. Oxidized portions of the polysilicon film are removed by applying ammonium fluoride.

The polysilicon film is patterned, forming the gate electrode of one MOS transistor. Then, using a resist pattern, arsenic ions are implanted, thereby forming the source and drain of the MOS transistor. Finally, an inter-layer insulating film is deposited on the MOSFETs, contact holes are made, and an aluminum wire and a pad are formed by known method. As a result of this, an integrated circuits is manufactured.

The advantages of the seventh embodiment can be attained also in the case of an integrated circuit which comprises an element having one small junction, as shown in FIG. 40.

Eighth Embodiment

Figure 27:
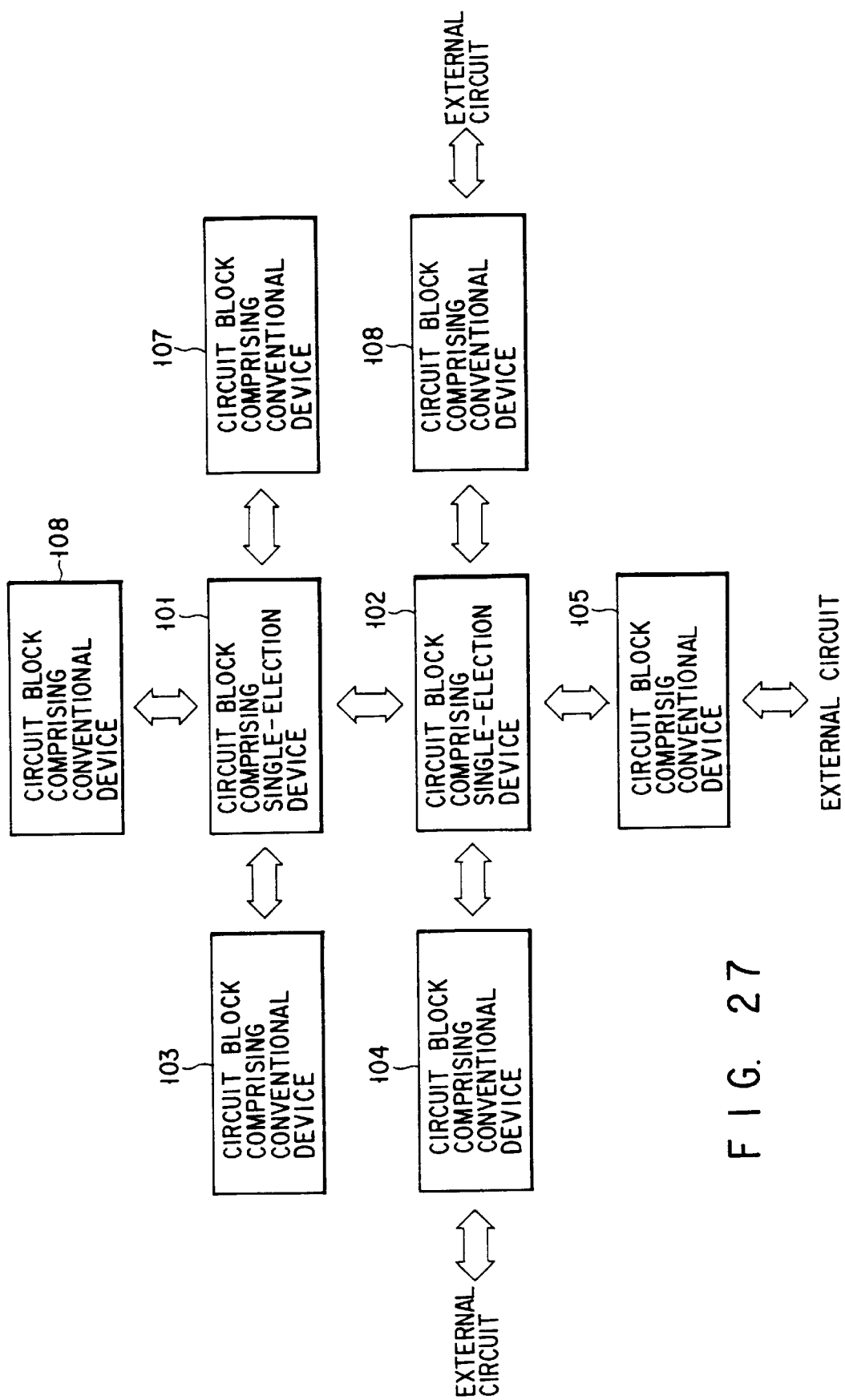
FIG. 27 is a block diagram illustrating an integrated circuit according to an eight embodiment of the present invention.

An integrated circuit according to the eighth embodiment of the invention will be described, with reference to FIG. 27. As shown in FIG. 27, the integrated circuit comprises eight circuit blocks 101 to 108. The circuit blocks 101 and 102 comprise single-electron transistors (SETs). The circuit blocks 101 and 102, each comprising SET. The block 101 is connected the input/output terminals of the blocks 103, 107 nd 108. The block 102 is connected to the input/output terminals of the blocks 104, 105 and 106. The blocks 104, 105 and 196 are connected to three external circuits, respectively. Thus, they serve to transfer data between the block 102 and external circuits.

The integrated circuit can be easily manufactured, composed of the circuit blocks 101 and 102 comprising SET which consume but a very little power and which can be made very small, and the circuit blocks 103 to 108 comprising MOSFET which operate at such a high voltage and such a large current that each block can receive and supply data to an external circuit.

As seen from FIG. 27, the circuit blocks 103 to 108 comprising MOSFETs are located around the circuit blocks 101 and 102 comprising SET. The SET is therefore isolated from the external circuit and thus prevented from making errors, though they are liable to be affected by noise. Hence, the blocks 101 and 102 can receive data from and output data to, any external circuit through a circuit block comprising MOSFET, both reliably and efficiently.

The MOSFET composing the circuit blocks 103 to 108 may, of course, be replaced by CMOS transistors or HEMTs.

Ninth Embodiment

A differential circuit, which is a ninth embodiment of the present invention, will be described with reference to FIG. 28.

Figure 28:
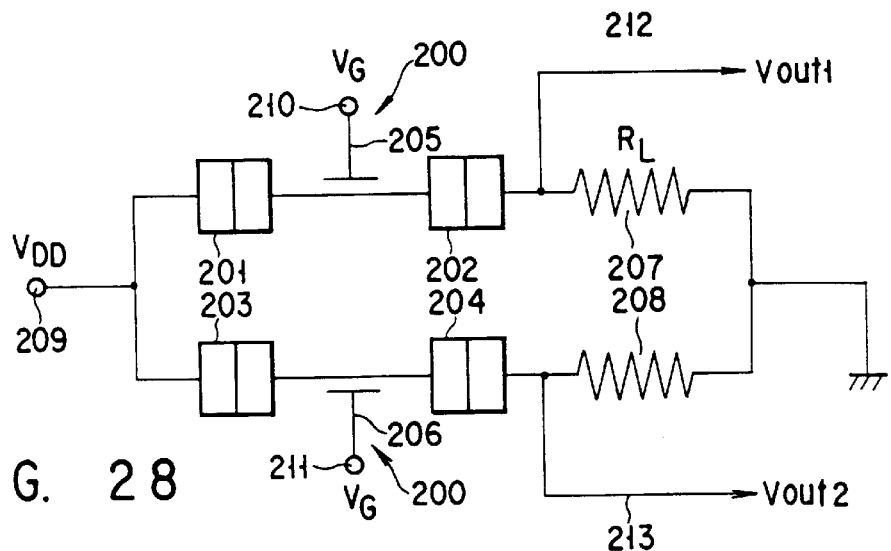
FIG. 28 is a diagram showing a differential circuit which is a ninth embodiment of the present invention.

As shown in FIG. 28, the differential circuit comprises two SETs 200 and 200'. The SET 200' is used as a dummy cell. The SET 200 has small junctions 201 and 202 and a gate electrode 210. One electrode of the junction 200 is connected to a VDD-applying terminal 209. The gate electrode 210 is formed on an insulating film (not shown) and located near the midpoint between the junctions 201 and 202. One electrode of the junction 202 is connected to the ground by a resistor 207. The node of this electrode of the junction 202 and the resistor 207 is connected to a first output terminal 212. The other SET 200 has small junctions 203 and 204 and a gate electrode 211. One electrode of the junction 203 is connected to the VDD-applying terminal 209. The gate electrode 211 is formed on the insulating film and located near the midpoint between the junctions 203 and 204. One electrode of the junction 204 is connected to the ground by a resistor 208. The node of this electrode of the junction 204 and the resistor 208 is connected to a second output terminal 213.

In operation, a dummy signal is supplied, as a reference signal, to either the gate electrode 210 or the gate electrode 211. A true input signal is supplied to the other gate electrode. The differential circuit compares the input signal with the dummy signal and outputs the difference as a difference between the voltages Vout 1 and Vout 2 at the output terminals 212 and 213. In other words, the circuit changes the level of the input signal, generating a differential output.

If comprised of circuit blocks different in terms of signal level, the differential circuit can be directly connected to a circuit block which comprises, for example, MOSFETs like the blocks 103 to 108 shown in FIG. 27. Having SETs 200 and 200', the differential circuit can be manufactured in the form of an integrated circuit which is very small and which operates at a very low power consumption.

Figure 29:
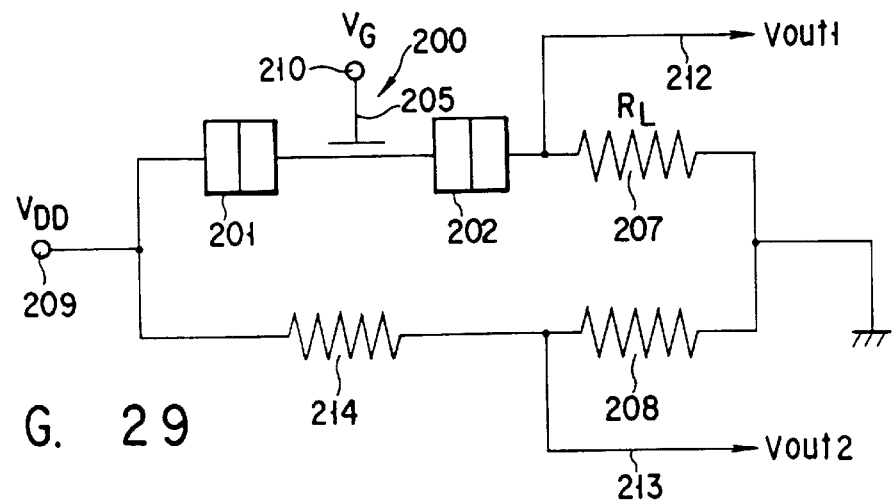
FIG. 29 is a diagram showing a modification of the differential circuit shown in FIG. 28.

FIG. 29 shows a modification of the differential circuit described above. In the modified circuit, a resistor 214 is used as dummy cell, in place of the SET 200'.

Tenth Embodiment

An integrated circuit according to a tenth embodiment of the invention will be described with reference to FIGS. 30, 31 and 36.

Figure 30:
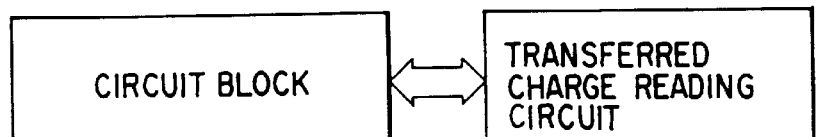
FIG. 30 is a block diagram showing an integrated circuit according to a tenth embodiment of the present invention.

As illustrated in FIG. 30, the integrated circuit comprises a circuit block 171 and a transferred charge reading circuit 172. The circuit block 171 comprises SET. The circuit 172 comprises a switching device and an amplifying device. It is designed to detect and output changes in charge which occur when the gate voltage of SET is swept at a predetermined rate. FIG. 36 is a circuit diagram corresponding to FIG. 30.

Figure 31:
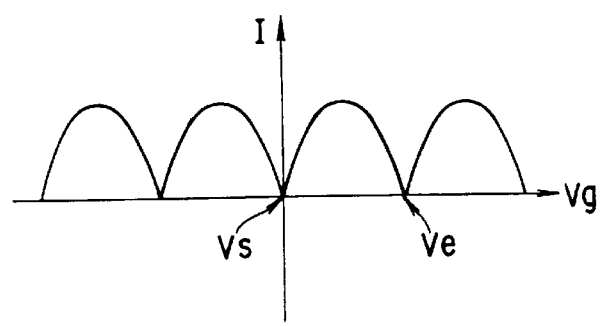
FIG. 31 is a graph showing the relation between the input voltage and output current of the single-electron transistors incorporated in the circuit shown in FIG. 30.

When the gate voltage of the SET is changed, the output current of the SET periodically changes as is illustrated in FIG. 31. This output current can be used as data. However, if a fixed charge exists in the SET, as usually is the case, the phase of the output current changes at random. If so, the SET cannot be controlled well enough to be used as a simple ON/OFF switch. Even so, the SET can be used as a multi-value output device even if an offset voltage is applied to it, as will be explained below.

The charge Q flows through the SET as the gate voltage of the SET is swept one period is represented as follows:

$$\int_{V_g}^{V_e} I(V_G) dV_G \times 1/\text{sweep rate}$$

$(V_e\text{–}V_g:$ gate voltage applied during sweep$)$ where Vg is the voltage applied to the gate at the start of each sweep and $V_e$ is the voltage applied to the gate at the end of each sweep.

As is understood from the above equation, the charge Q does not change even if an offset voltage is applied to the SET, so long as the sweep rate remains the same. Hence, if the charge Q is used as output data, the SET is free of the influence of the fixed charge.

Eleventh Embodiment

A circuit according to an eleventh embodiment of this invention will be described.

The circuit comprises an SET, as shown in FIG. 37.

The ON/OFF period of the SET are determined by the capacitance $C_g$ between the gate and intermediate electrodes of the SET. When the gate voltage is changed by a specific value which is far less than $e/2C_g$, the current flowing in the SET or the current flowing therefrom change little. When the gate voltage is changed by a value almost equal to $e/^2C_g$, the current changes by the current difference between ON/OFF. Thus, if the capacitance $C_g$ is used as data, the SET will function as a ROM cell which is free of the influence of a fixed charge.

FIG. 38 is a graph showing a relation between a current flowing through the SED and the gate voltage. In FIG. 38, curve a shows the case in which Cg is small, and curve b shows the case in which Cg is large. When change in Vin is small, ON/OFF of the SED can not be inversed in the case in which Cg is small. Vout can not be, therefore, inversed.

Twelfth Embodiment

An integrated circuit according to the twelfth embodiment of the present invention will be described. The twelfth embodiment comprises MOSFETs and SETs. The MOSFETs are made by a method which is compatible with the method of producing SETs. How each MOSFET is made will be explained, with reference to FIGS. 32A to 35B.

FIG. 32A is a plan view, and FIG. 32B is a sectional view, taken along line 32B—32B in FIG. 32A. At first, as FIGS. 32A and 32B show, an oxide film 704 is formed on a silicon substrate 703. Next, as shown in FIG. 32B, an opening is made in a selected part of the oxide film 704, exposing a part of the substrate 703. A polysilicon layer is formed on the entire surface of the resultant structure. That portion of the polysilicon layer which contacts the exposed part of the substrate 704 is made into single-crystal silicon. A SOI layer is thereby provided. Further, an device-isolating region 701 is formed, surrounding the device region of the silicon layer, by means of LOCOS method or the like.

Next, as shown in FIG. 33, an oxide film having a thickness of about 10 nm is formed on the surface of the resultant structure by thermal oxidation or the like. A resist pattern is then formed on the oxide film. Using the resist pattern as a mask, an impurity such as arsenic is ion-implanted, thereby forming a source region 705 and a drain region 706. After the resist pattern is removed, an oxide film having a thickness of about 400 nm is deposited on the resultant structure.

Figure 34:
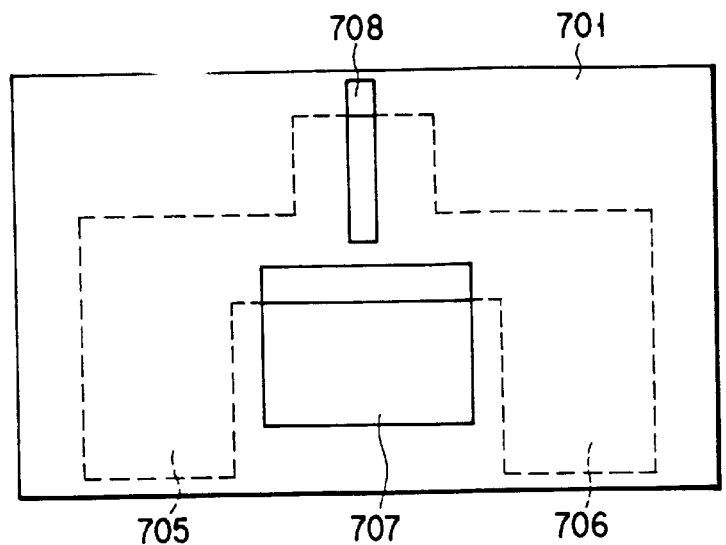
FIG. 34 is a plan view explaining how channel regions are etched producing FETs included in the integrated circuit.
Figure 35A:
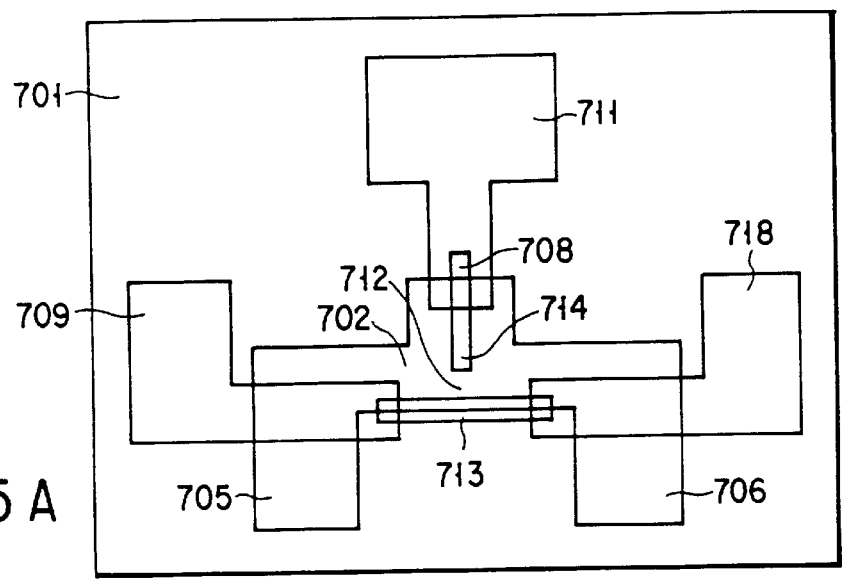
FIGS. 35A and 35B are a plan view and a sectional view, explaining how gate electrodes and lead electrodes are formed in producing FETs included in the integrated circuit.
Figure 35B:
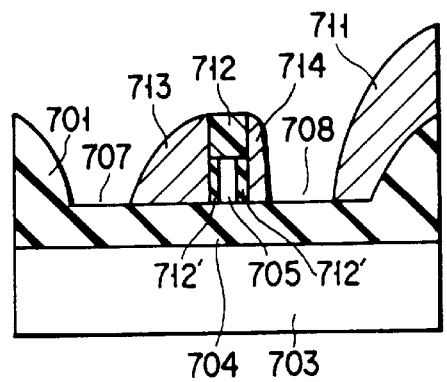

As shown in FIG. 34, a resist pattern is formed on the entire surface of the structure. The resist pattern has two openings 707 and 708. Using this resist pattern as mask, those portions of the oxide film exposed through the openings 707 and 708 and those portions of the silicon layer which are below the openings 707 and 708 are etched away. It is desirable to the openings 707 and 708 be as close as possible to each other so that the gate voltage of the MOSFET may be controlled efficiently. More precisely, the openings 707 and 708 should be spaced apart by a distance less than the length of the depletion layer which extends in the inversion region when the gate voltage is controlled. This is because an opening will be made in the oxide film and the silicon layer and an gate electrode will be formed on the sides of this opening. In the present embodiment, the distance is 0.1 μm.

Thereafter, a gate insulating film 712' having a thickness of about 20 nm is formed on the sides of the opening made in the silicon layer.

A conductive layer, such as a polysilicon layer, is deposited on the resultant structure. An impurity such as phosphorus is diffused, and anisotropic etching such as RIE is performed, thereby forming gate electrodes 713 and 714 on the side of a gate insulating film 712' and the side of the oxide film 712, respectively. Lead-out electrodes 709, 710 and 711, connected to the gate electrodes 713 and 714, are formed by depositing and etching a conductive film. Thus, a MOSFET is formed. One of the gate electrodes 713 and 714 thus provided is used to control the channel of the MOSFET, and the other gate electrode is used to control the potential of the silicon substrate 703. The MOSFET region is covered with a protective film.

After the MOSFETs are made by the method described above, SETs are formed on the same silicon substrate 703. Hence, an integrated circuit of the type shown in FIG. 27 can be manufactured easily.

As has been described, the present invention can provide a semiconductor device which has circuit blocks comprising single-electron transistors and circuit blocks comprising field-effect transistors. Including single-electron transistors which consume a very little power and which are very small, the device can operate at a low power consumption and can be made small. The blocks comprising field-effect transistors surround the blocks comprising single-effect transistors. Therefore, each single-electron transistor having small tunnel junctions is isolated far from an external circuit, free from the influence of external noise.

Also, the present invention can provide a semiconductor device comprising an input/output section comprising field-effect transistor and an SET section connected to the input/output section and comprising single-electron transistors. The input/output section may be connected to a circuit which comprises conventional devices and which is located far from the SET section. The single-electron transistor is scarcely influenced by the voltage of several volts which drives the field-effect transistors or the noise generated while the field-effect transistor is being driven. The semiconductor device can therefore operate reliably.

Further, the present invention can provide a semiconductor device which comprises a functional block having a single-electron device having a small tunnel junction, and a circuit block having field-effect transistors and connected to the functional block. Having a single-electron device, the device can be a high-efficiency, high-density integrated circuit which can operate at a low power consumption.

Additional advantages and modifications will readily occur to those skilled in the art. Therefore, the invention in its broader aspects is not limited to the specific details, and representative devices shown and described herein. Accordingly, various modifications may be made without departing from the spirit or scope of the general inventive concept as defined by the appended claims and their equivalents.

What is claimed is:

1. A semiconductor device comprising:
   a circuit block including a small tunnel junction device; and
   a circuit for reading a charge in said small tunnel junction device,
   wherein said small tunnel junction device has a first electrode and a second electrode for controlling the first electrode, and outputs as data a charge transferred during a predetermined period for which a voltage at said second electrode is swept.

2. A semiconductor device comprising:
   a circuit block including a small tunnel junction device; and
   a circuit for reading a charge in said small tunnel junction device,
   wherein said small tunnel junction device has a first electrode and a second electrode for controlling the first electrode, and outputs as data a capacitance between said first and second electrodes.

3. A semiconductor device comprising:
   a semiconductor substrate;
   an insulating layer provided on said semiconductor substrate;
   a semiconductor layer provided on said insulating layer and having first and second regions;
   a field-effect transistor provided in the first region of said semiconductor layer; and
   a single-electron transistor provided in the second region of said semiconductor layer;
   wherein said single-electron transistor has an intermediate electrode located in the second region of said semiconductor layer, and said field-effect transistor includes:
      a source region and a drain region spaced apart from the first region;
      a channel region located between said source and drain regions and having side walls on both sides thereof;
      a pair of gate insulating films provided on the side walls of said channel region, respectively;
      a first gate electrode provided on one of said gate insulating films; and
      a second gate electrode provided on the other of said gate insulating films.

* * * * *

UNITED STATES PATENT AND TRADEMARK OFFICE
CERTIFICATE OF CORRECTION

PATENT NO. : 5,963,471

DATED : October 5, 1999

INVENTOR(S): Akiko OHATA, et al.

It is certified that an error appears in the above-identified patent and that said Letters Patent is hereby corrected as shown below:

On the title page, item [62] has been omitted. It should read as follows:

--Related U.S. Application Data

[62] Division of Serial No. 08/616,458,
Mar. 15, 1996, Pat. No. 5,754,077.--

Signed and Sealed this

Twenty-third Day of May, 2000

Attest:

Q. TODD DICKINSON

*Attesting Officer*     *Director of Patents and Trademarks*